United States Patent
Kim et al.

(10) Patent No.: US 10,304,932 B2
(45) Date of Patent: May 28, 2019

(54) SEMICONDUCTOR DEVICE HAVING A FIN STRUCTURE AND A MANUFACTURING METHOD THEREOF

(71) Applicant: Samsung Electronics Co., Ltd., Suwon-si (KR)

(72) Inventors: Dong-woo Kim, Incheon (KR); Hyun-ho Noh, Hwaseong-si (KR); Yong-seung Kim, Hwaseong-si (KR); Dong-suk Shin, Yongin-si (KR); Kwan-heum Lee, Suwon-si (KR); Yu-yeong Jo, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/871,374

(22) Filed: Jan. 15, 2018

(65) Prior Publication Data

US 2019/0006469 A1    Jan. 3, 2019

(30) Foreign Application Priority Data

Jun. 29, 2017 (KR) .................. 10-2017-0082910

(51) Int. Cl.
| | |
|---|---|
| *H01L 29/80* | (2006.01) |
| *H01L 21/00* | (2006.01) |
| *H01L 29/161* | (2006.01) |
| *H01L 29/08* | (2006.01) |
| *H01L 29/78* | (2006.01) |
| *H01L 29/04* | (2006.01) |
| *H01L 29/167* | (2006.01) |

(52) U.S. Cl.
CPC .......... *H01L 29/161* (2013.01); *H01L 29/045* (2013.01); *H01L 29/0847* (2013.01); *H01L 29/167* (2013.01); *H01L 29/785* (2013.01)

(58) Field of Classification Search
CPC ..... H01L 21/823431; H01L 21/823487; H01L 21/823821; H01L 21/823885; H01L 29/785; H01L 29/78642; H01L 29/7926; H01L 29/66795; H01L 29/66545; H01L 27/0886; H01L 27/0924; H01L 27/10841
USPC ........ 257/220, 263, 328, 330, 331; 438/156, 438/173, 192, 212, 268
See application file for complete search history.

(56) References Cited

U.S. PATENT DOCUMENTS

| | | |
|---|---|---|
| 8,263,451 B2 | 9/2012 | Su et al. |
| 9,431,537 B2 | 8/2016 | Maeda et al. |
| 9,450,047 B1 | 9/2016 | Liao et al. |

(Continued)

*Primary Examiner* — Hsien Ming Lee
(74) *Attorney, Agent, or Firm* — Muir Patent Law, PLLC

(57) ABSTRACT

Provided is a semiconductor device including: a fin structure on a substrate including a negative channel field-effect transistor (nFET) region and a positive channel field-effect transistor (pFET) region; a gate structure on the fin structure; and a source/drain structure adjacent to the gate structure, wherein the source/drain structure formed in the nFET region is an epitaxial layer including an n-type impurity at a concentration of about $1.8 \times 10^{21}/\text{cm}^3$ or more, includes silicon (Si) and germanium (Ge) on an outer portion of the source/drain structure, and includes Si but not Ge in an inner portion of the source/drain structure, wherein an inclined surface contacting an uppermost surface of the source/drain structure forms an angle of less than about 54.7° with a top surface of the fin structure.

19 Claims, 14 Drawing Sheets

(56) References Cited

U.S. PATENT DOCUMENTS

| | | | |
|---|---|---|---|
| 9,455,331 B1 | 9/2016 | Cai et al. | |
| 9,530,638 B2 | 12/2016 | Dube et al. | |
| 9,530,661 B2 | 12/2016 | Kim et al. | |
| 9,559,189 B2 | 1/2017 | Chien et al. | |
| 9,559,207 B2 | 1/2017 | Lo et al. | |
| 9,607,838 B1* | 3/2017 | Lin | H01L 29/7842 |
| 9,831,116 B2* | 11/2017 | Lee | H01L 21/764 |
| 2005/0056892 A1 | 3/2005 | Seliskar | |
| 2012/0228711 A1 | 9/2012 | Hoshino | |
| 2014/0203338 A1* | 7/2014 | Kelly | H01L 29/785 |
| | | | 257/288 |
| 2014/0252489 A1 | 9/2014 | Yu et al. | |
| 2015/0179645 A1* | 6/2015 | Liao | H01L 29/41791 |
| | | | 257/77 |
| 2016/0240623 A1 | 8/2016 | Chang et al. | |
| 2016/0351663 A1 | 12/2016 | Park et al. | |

* cited by examiner

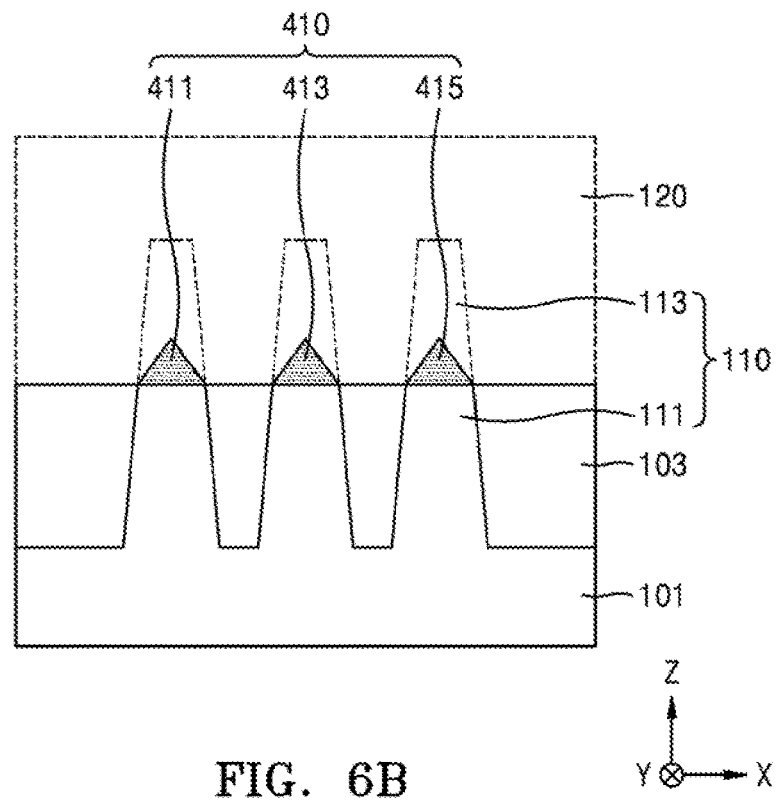
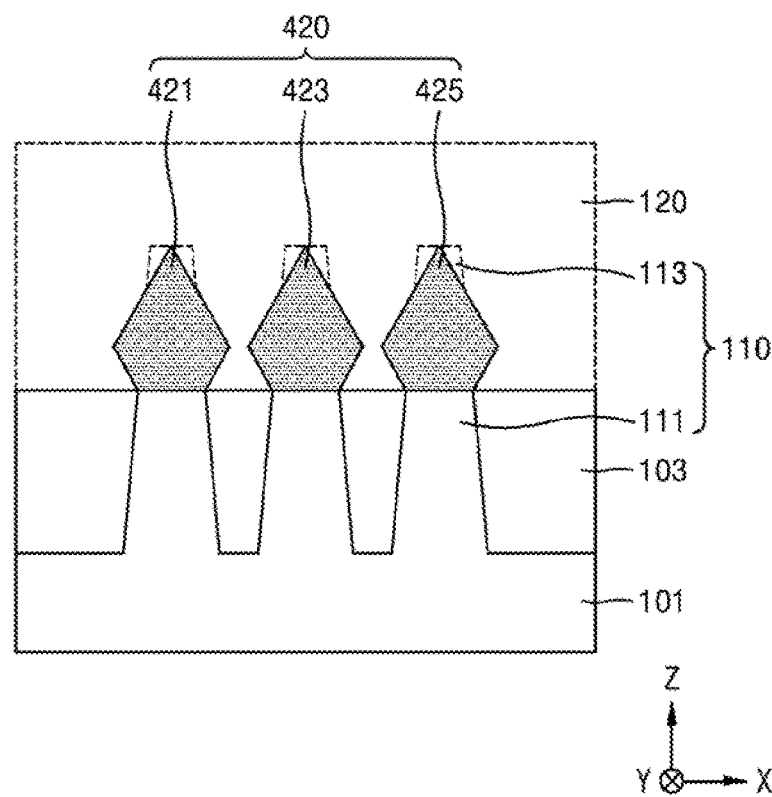

SEMICONDUCTOR DEVICE HAVING A FIN STRUCTURE AND A MANUFACTURING METHOD THEREOF

CROSS-REFERENCE TO RELATED APPLICATION

This application claims the benefit of priority under 35 U.S.C § 119 to Korean Patent Application No. 10-2017-0082910, filed on Jun. 29, 2017, in the Korean Intellectual Property Office, the disclosure of which is incorporated herein in its entirety by reference.

BACKGROUND

The present disclosure relates to a semiconductor device, and more particularly, to a semiconductor device including a fin field effect transistor (FinFET).

In order to realize high-capacity and highly integrated devices, semiconductor devices have been continuously scaled down. Critical dimensions including minimum features sizes of semiconductor devices have been reduced for increasing a density of the semiconductor devices. However, in a semiconductor device having a two-dimensional (2D) planar structure, a short channel effect may limit scaling down of the semiconductor devices because a length of a horizontal channel may be shortened as the size of the semiconductor device is reduced. To address this short channel effect, a fin field-effect transistor (FinFET) having a fin structure has been introduced. The structural characteristics of the FinFET may prevent the short channel effect by securing an effective channel length and increase an operating current magnitude by increasing a channel width.

SUMMARY

An aspect of the inventive concept according to exemplary embodiments provides a realization of a semiconductor device having excellent electrical characteristics and manufacturing efficiency.

Aspects of the inventive concept should not be limited by the above description, and other unmentioned aspects will be clearly understood by one of ordinary skill in the art from example embodiments described herein.

According to an aspect of the inventive concept, there is provided a semiconductor device including: a fin structure on a substrate including a negative channel field-effect transistor (nFET) region; a gate structure formed on the fin structure; and a source/drain structure formed adjacent to the gate structure, the source/drain structure being formed with an epitaxial layer n-type impurity, the concentration of the n-type impurity is about $1.8 \times 10^{21}/cm^3$ or more, and the outer portion of the source/drain structure including silicon (Si) and germanium (Ge), and the inner portion of the source/drain structure including Si but not Ge, and wherein an inclined surface portion of an uppermost surface of the source/drain structure forms an angle of less than about 54.7° with a top surface of the fin structure.

According to another aspect of the inventive concept, there is provided a semiconductor device including: a fin structure disposed on a substrate; a gate structure on the fin structure; and a source/drain structure adjacent to the gate structure, wherein the source/drain structure forms a source/drain assembly in which adjacent source/drain structures are merged with each other via a (110) crystal surface and the source/drain assembly includes a different material on an outer portion of the source/drain assembly which is not included in an inner portion of the source/drain assembly.

According to another aspect of the inventive concept, there is provided a semiconductor device including a fin structure on a substrate including the nFET region and the pFET region; an element isolating layer between the fin structures; a gate structure on the fin structure; and a source/drain structure adjacent to the gate structure, wherein the source/drain structure formed in the nFET region includes: a top pattern of the fin structure which is a portion of the fin structure protruding over the element isolating layer; and a selective epitaxial growth (SEG) portion formed on a top surface and side surfaces of the top pattern of the fin structure, wherein an angle between an inclined surface portion of an uppermost surface of the SEG portion and the top surface of the top pattern of the fin structure is less than about 54.7°, and the SEG portion includes Si and Ge on an outer portion of the SEG portion and includes Si but not Ge in an inner portion of the SEG portion.

BRIEF DESCRIPTION OF THE DRAWINGS

Embodiments of the inventive concept will be more clearly understood from the following detailed description taken in conjunction with the accompanying drawings in which:

FIGS. 6A through 6D are cross-sectional views illustrated according to a process sequence to describe a method of fabricating a semiconductor device according to an exemplary embodiment of the inventive concept.

DETAILED DESCRIPTION OF THE EMBODIMENTS

Hereinafter, embodiments of the inventive concept will be described in detail with reference to the accompanying drawings.

Figure 1A:
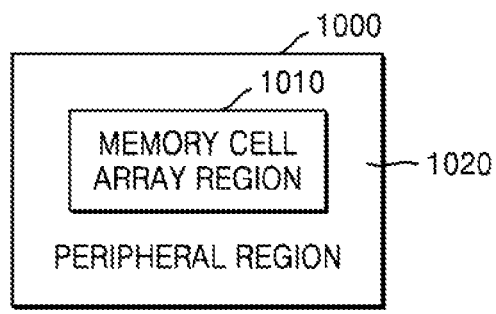
FIG. 1A and FIG. 1B are block diagrams that illustrate conceptual diagrams of semiconductor devices 1000, 1100, respectively.
Figure 1B:
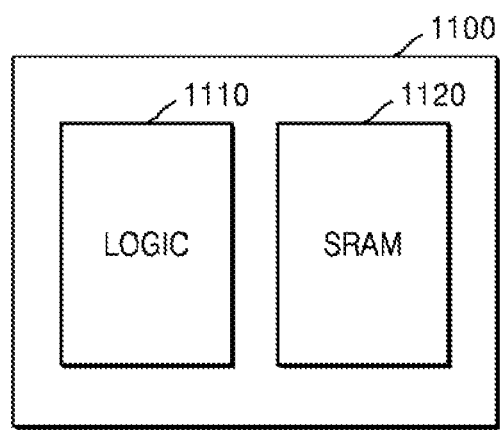

FIG. 1A and FIG. 1B are block diagrams that illustrate conceptual diagrams of semiconductor devices 1000, 1100, respectively.

Referring to FIG. 1A, the semiconductor device 1000 may include a memory cell array region 1010 and a peripheral circuit region 1020 which is disposed around the periphery of the memory cell array region 1010.

A memory element may be arranged in the memory cell array region 1010. The memory element may be a static random-access memory (RAM) (SRAM), a dynamic RAM (DRAM), a magnetic RAM (MRAM), a phase change RAM (PRAM), and a resistive RAM (RRAM), but the disclosure is not limited thereto.

A circuit element for driving the memory element arranged in the memory cell array region 1010 may be arranged in the peripheral circuit region 1020. The circuit element may include a read circuit, a write circuit, and other control circuits, but the disclosure is not limited thereto.

Referring to FIG. 1B, the semiconductor device 1100 may include a logic region 1110 and an SRAM region 1120.

The logic region 1110 may include various circuits and/or memory elements combined with the circuits.

The logic region 1110 and the SRAM region 1120 are illustrated as examples, but the embodiment is not limited thereto. Another memory elements such as DRAM, MRAM, PRAM, RRAM, and the flash memory may be used.

Figure 2:
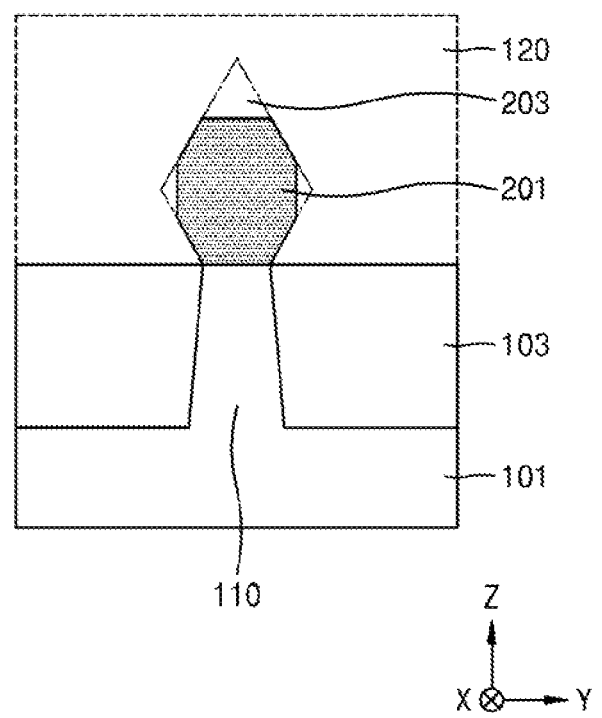
FIG. 2 is a schematic cross-sectional view of a fin field effect transistor (FinFET) according to an exemplary embodiment.

FIG. 2 is a schematic cross-sectional view of a fin field effect transistor (FinFET) according to an exemplary embodiment.

Referring to FIG. 2, a cross-sectional view of the FinFET including a first source/drain structure 201 and a gate structure 120 formed on a top surface of a fin structure 110 is schematically illustrated. The FinFET structure may be formed with epitaxial layers grown on a substrate 101.

Unlike a two-dimensional (2D) planar FET, the FinFET may include a region of the first source/drain structure 201 which is not limited by an element isolating layer 103. A profile of the first source/drain structure 201 may be in a form of a facet. A rhombus, a hexagon, or an octagon may be formed due to different growth rates of crystal surfaces of the epitaxial layer depending on constituent materials. The first source/drain structure 201 may form a contact region or a merged region (hereinafter, referred to as the contact region) with the epitaxial layer grown adjacent to first source/drain structure 201. For example, the first source/drain structure 201 may form a source/drain assembly in which adjacent source/drain structures are merged with each other via a (110) crystal surface.

As a measure for improving performance of the semiconductor device in the logic region 1110 (refer to FIG. 1B), there is a trend to form a second source/drain structure 203 including a high concentration of impurities to reduce contact resistance. The high concentration of impurities may further promote the growth of the crystal surfaces constituting the top side and the lateral side surfaces of the epitaxial layer which may be (111) crystal surfaces, and thus, the contact region between the adjacent second source/drain structures 203 including the high concentration of impurities may be reduced. Due to the reduced contact region, defects such as cracks in the contact region may result in subsequent processes of forming of a contact plug. As a result, the reduced contact region between the adjacent second source/drain structures 203 including the high concentration of impurities may affect electrical characteristics and manufacturing efficiency of a semiconductor device.

Figure 3:
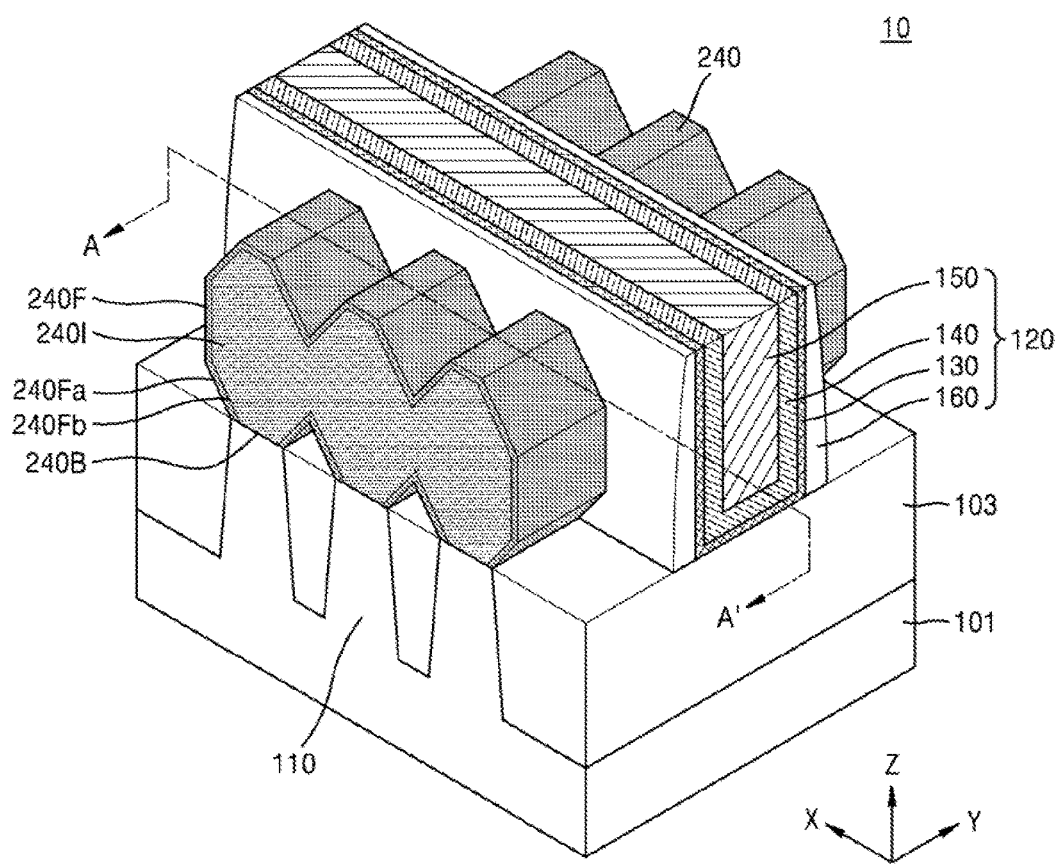
FIG. 3 is a schematic perspective view of a semiconductor device according to an exemplary embodiment of the inventive concept.

FIG. 3 is a schematic perspective view of a semiconductor device 10 according to an exemplary embodiment of the inventive concept.

Referring to FIG. 3, the semiconductor device 10 may include the FinFET including a source/drain assembly 240 on the substrate 101.

The semiconductor device 10 may include the substrate 101, the element isolating layer 103, the fin structures 110, the source/drain assembly 240, and the gate structure 120.

In some embodiments, the substrate 101 may be a semiconductor crystalline material (e.g., crystalline silicon wafer or crystalline SiGe wafer). For example, the substrate 101 may include silicon (Si) such as monocrystalline Si, polycrystalline Si, or amorphous Si. However, a material of the substrate 101 is not limited to Si. In some embodiments, the substrate 101 may include a Group IV semiconductor such as germanium (Ge), a Group IV-IV compound semiconductor such as Si germanium (SiGe) and Si carbide (SiC), or a Group III-V compound semiconductor such as gallium arsenide (GaAs), indium arsenide (InAs), and indium phosphide (InP).

The substrate 101 may be based on a Si bulk substrate or a silicon on insulator (SOI) substrate. In the semiconductor device 10, the substrate 101 may be based on the Si bulk substrate. In addition, the substrate 101 is not limited to the bulk or the SOI substrate and may be a substrate based on an epitaxial wafer, a polished wafer, or an annealed wafer.

Although not illustrated, the substrate 101 may include a conductive region, for example, a well doped with an impurity, or various structures doped with impurities. In addition, the substrate 101 may form a p-type substrate or an n-type substrate depending on the kind of dopant ions.

The substrate 101 may be classified into various regions depending on the types of elements formed thereon. For example, the substrate 101 may be classified into a logic region where a logic element or a computing element is formed and a memory region where a memory element is formed. However, the regions of the substrate 101 may not be classified into only the logic region and the memory region.

The element isolating layer 103 may be arranged on the substrate 101 with a certain height and may be formed of an insulating material. For example, the element isolating layer 103 may include any one of an oxide layer, a nitride layer, and an oxynitride layer. The element isolating layer 103 may be arranged between the fin structures 110 to electrically isolate each of the fin structures 110.

The fin structures 110 may have a structure in which a plurality of fin structures 110 are arranged in a first direction (X direction) and extend in parallel with each other in a second direction (Y direction) perpendicular to the first direction (X direction). The fin structures 110 may have a structure which begins at the substrate 101 (correct expression?) and extends in a third direction (Z direction) perpendicular to the first and second directions (X and Y directions). The fin structures 110 may be formed on the substrate 101 as a base. Accordingly, the fin structures 110 may include the same material as the substrate 101.

Impurity ions may be heavily doped on the top surfaces of the fin structures 110 on both sides of the gate structure 120 in the second direction (Y direction) to form the source/drain assembly 240.

The source/drain assembly 240 may be an epitaxial layer including a high concentration of phosphorus (P) as an impurity. The source/drain assembly 240 may include an outer portion 240F and an inner portion 240I. The outer portion 240F of the source/drain assembly 240 may include an outer surface 240Fa and an inner surface 240Fb. The inner surface 240Fb conformally contacts the inner portion 240I of the source/drain assembly 240 except for a lowermost portion 240B of the source/drain assembly 240. According to an exemplary embodiment, the outer portion 240F of the source/drain assembly 240 including the outer surface 240Fa and the inner surface 240Fb may include Si and Ge, and the inner portion 240I of the source/drain assembly 240 may include Si but not Ge. According to an exemplary embodiment, the lowermost portion 240B of the source/drain assembly 240 that contacts the top surfaces of the fin structures 110 may include Si but not Ge. For example, the lowermost portion 240B, which is the lowermost portion of the inner portion 240I of the source/drain assembly 240 that contacts the top surfaces of the fin structures 110, includes Si but not Ge. In this exemplary embodiment, the lowermost portion 240B of the source/drain assembly 240 (lowermost portion of the inner portion 240I), the top surfaces of the fin structures 110 and the top surface of the element isolating layer 103 are coplanar. According to an exemplary embodiment of the inventive concept, the semiconductor device 10 may include the source/drain assembly 240 including a contact region which has a sufficient size while having a width satisfying a certain value in accordance with a design rule. The gate structure 120 may be formed on the element isolating layer 103 as a structure extending in the first direction (X direction) while covering the fin structures 110. Although only one gate structure 120 is illustrated in FIG. 3, a plurality of gate structures 120 may be formed in the second direction (Y direction). When an element is referred herein to as being "contacting" or "in contact with" another element, there are no intervening elements present.

The gate structure 120 may include a gate insulating layer 130, a work function control layer 140, a gate electrode 150, and a spacer 160. The gate insulating layer 130 may cover both side surfaces and the top surfaces of the fin structures 110 and may have a uniform thickness.

The gate insulating layer 130 may include an insulating material. The gate insulating layer 130 may include an oxide such as silicon oxide ($SiO_x$) or a nitride such as silicon nitride (SiNx). Alternatively, the gate insulating layer 130 may include a high-k dielectric material. The gate insulating layer 130 may also be formed on the element isolating layer 103. In other embodiments, the gate insulating layer 130 may not be formed on the element isolating layer 103.

The work function control layer 140 may be formed on the gate insulating layer 130. The work function control layer 140 may adjust a work function of a transistor. In other embodiments, the work function control layer 140 may not be formed. The work function control layer 140 may, as illustrated, extend upward in a direction perpendicular (Z direction) to an upper surface of the substrate 101 along the inner side surfaces of the gate insulating layer 130. The work function control layer 140 may include a metal compound. For example, the work function control layer 140 may include titanium nitride (TiN), tantalum nitride (TaN), titanium carbide (TiC), or tantalum carbide (TaC).

The gate electrode 150 may cover both side surfaces and the top surface of the fin structure 110 via the gate insulating layer 130. The gate electrode 150 may extend in the first direction (X direction) like the gate structure 120. The gate electrode 150 may include polycrystalline Si or a conductive material doped on polycrystalline Si with a metal material such as aluminum (Al), nickel (Ni), tungsten (W), titanium (Ti), and tantalum (Ta). In addition, the gate electrode 150 may include a metal compound such as TiN, TaN, TiC, or TaC.

The spacer 160 may be formed over both side surfaces of the gate electrode 150. The spacer 160 may include an insulating material. For example, the spacer 160 may include any one of an oxide layer, a nitride layer, and an oxynitride layer.

FIGS. 4A through 4G are cross-sectional views illustrated in a process sequence to describe a method of manufacturing a semiconductor device according to an embodiment of the inventive concept.

FIGS. 4A through 4F are cross-sectional views corresponding to a cross-section taken along line A-A' in FIG. 3.

Figure 4A:
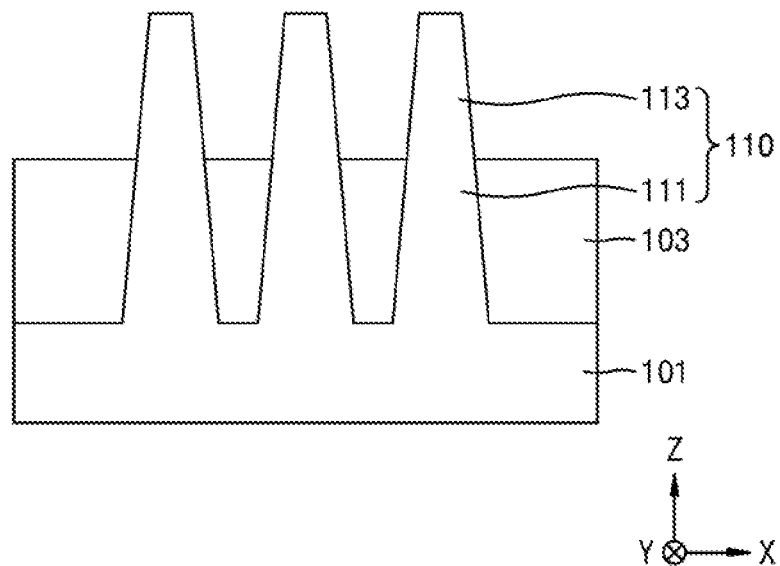
FIGS. 4A through 4G are cross-sectional views illustrated according to a process sequence to describe a method of manufacturing a semiconductor device according to an exemplary embodiment of the inventive concept.

Referring to FIG. 4A, the fin structure 110 may protrude above the top surface of the device isolating layer 103.

A semiconductor layer (not illustrated) may be formed on the substrate 101. The semiconductor layer may be formed directly on, and may contact the substrate 101. The semiconductor layer may be formed via an epitaxial growth process.

The semiconductor layer may include a material having a different lattice constant from the substrate 101. When the substrate 101 is a Si substrate, the semiconductor layer may include a material having a larger lattice constant than Si or a material having a lower lattice constant than Si.

When the semiconductor layer is used as an nFET region, the semiconductor layer may include, for example, SiC. Alternatively, when the semiconductor layer is used as a pFET region, the semiconductor layer may include, for example, SiGe.

The semiconductor layer formed on the substrate 101 may be in a fully strained state. For example, the lattice constant of the semiconductor layer may be the same as that of the substrate 101. A thickness of the semiconductor layer formed on the substrate 101 may be equal to or less than a critical thickness so that the semiconductor layer is in the fully strained state. For example, when the semiconductor layer includes SiGe (e.g., when the semiconductor layer is used as a pFET region), fully strained state may mean that the in-plane lattice constant of the SiGe layer, which is larger than that of the Si substrate, is compressed so that it matches that of the Si substrate.

Next, the semiconductor layer and a portion of the substrate 101 may be patterned to form the fin structure 110 on the substrate 101. The fin structure 110 may be formed on the substrate 101 so as to extend in the second direction (Y direction).

Next, the element isolating layer 103 may be formed on the substrate 101. The element isolating layer 103 may include the material described above with reference to FIG. 3. The top surface of the fin structure 110 and the top surface of the element isolating layer 103 may be arranged on the same plane via a planarization process.

Next, a portion of the element isolating layer 103 may be recessed. In this manner, the fin structure 110 may protrude above the top surface of the element isolating layer 103. For example, the element isolating layer 103 may be formed to contact a portion of the side walls of the fin structure 110. The fin structure 110 may be defined by the element isolating layer 103. A portion of the fin structure 110 protruding above the element isolating layer 103 may be defined as a top pattern 113 of the fin structure 110 and a remaining portion may be defined as a bottom pattern 111 of the fin structure 110.

In addition, impurity doping for adjusting a threshold voltage may be performed onto the fin structure 110. When the pFET is fabricated by using the fin structure 110, a p-type impurity may be boron (B). Alternatively, when the nFET is fabricated by using the fin structure 110, an n-type impurity may be P or As. For example, doping for adjusting the threshold voltage may be performed onto the top pattern 113 of the fin structure 110 which is used as a channel region of a transistor.

Figure 4B:
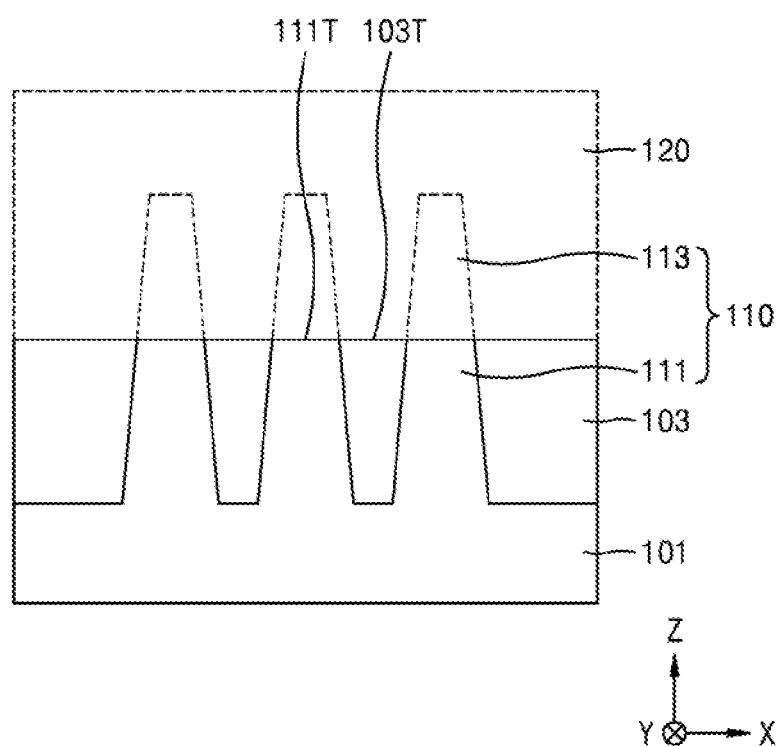

Referring to FIG. 4B, the gate structure 120 intersecting with the fin structure 110 and extending in the first direction (X direction) may be formed and the bottom pattern 111 of the fin structure 110 may be formed by removing the top pattern 113 of the fin structure 110 exposed at both sides of the gate structure 120.

Dashed lines in figures are provided for describing the elements which exist after having recessed.

The gate structure 120 may include the gate insulating layer 130 and the gate electrode 150. In some embodiments, the gate structure 120 may be formed via a gate replacement process, but is not limited thereto.

Next, the top pattern 113 of the fin structure 110 exposed at both sides of the gate structure 120 may be removed to form the bottom pattern 111 of the fin structure 110. For example, portions of the fin structure 110 that do not overlap the gate structure 120 may be removed to form the recesses on both side surfaces of the gate structure 120. A top surface 111T of the bottom pattern 111 of the fin structure 110 may be arranged on the same plane as a top surface 103T of the element isolating layer 103 via the recesses.

Figure 4C:
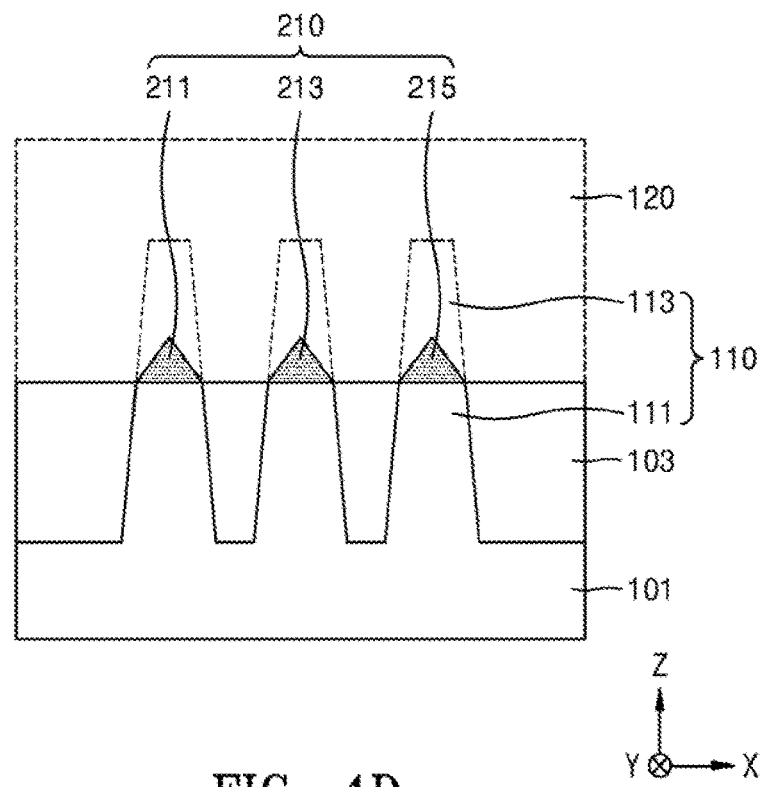

Referring to FIG. 4C, a first source/drain layer 210 may be formed on the bottom pattern 111 of the fin structure 110.

Respective source/drain layers 211, 213, and 215 of the first source/drain layer 210 may be grown separately from each other on the bottom pattern 111 of the fin structure 110 at a uniform height. In some embodiments, the first source/drain layer 210 may be grown from the bottom pattern 111 of the fin structure 110 via a selective epitaxial growth (SEG) process. In addition, the first source/drain layer 210 may include a doped compound, such as boron (B) which is a p-type impurity, and such as phosphorus (P) which is an n-type impurity. The impurity may be doped in a separate process, or the impurity may be doped in-situ during the epitaxial growth.

Here, a process of forming the first source/drain layer 210 in the nFET region by doping with P, which is an n-type impurity, will be described. In some embodiments, a doping concentration of P in the first source/drain layer 210 may be about $1.8 \times 10^{21}/cm^3$ or more. As described above, contact resistance may be decreased by doping the first source/drain layer 210 with a high concentration of impurities.

As illustrated in FIG. 4C, the first source/drain layer 210 may include three adjacent source/drain layers 211, 213, and 215 on the bottom pattern 111 of the fin structure 110, but is not limited thereto.

SEG including Si and being doped with a high concentration of impurities may cause sharp protrusions to the top surfaces and the side surfaces thereof. A crystal structure formed by the epitaxial growth may be formed such that the sharp protrusions from the top surfaces and the side surfaces have certain angles. However, since the crystal structure typically tends to grow so as to have a constant aspect ratio, the aspect ratio of the epitaxial growth may be kept constant. As the first source/drain layer 210 grows, an area occupied by the first source/drain layer 210 may gradually increase.

Figure 4D:
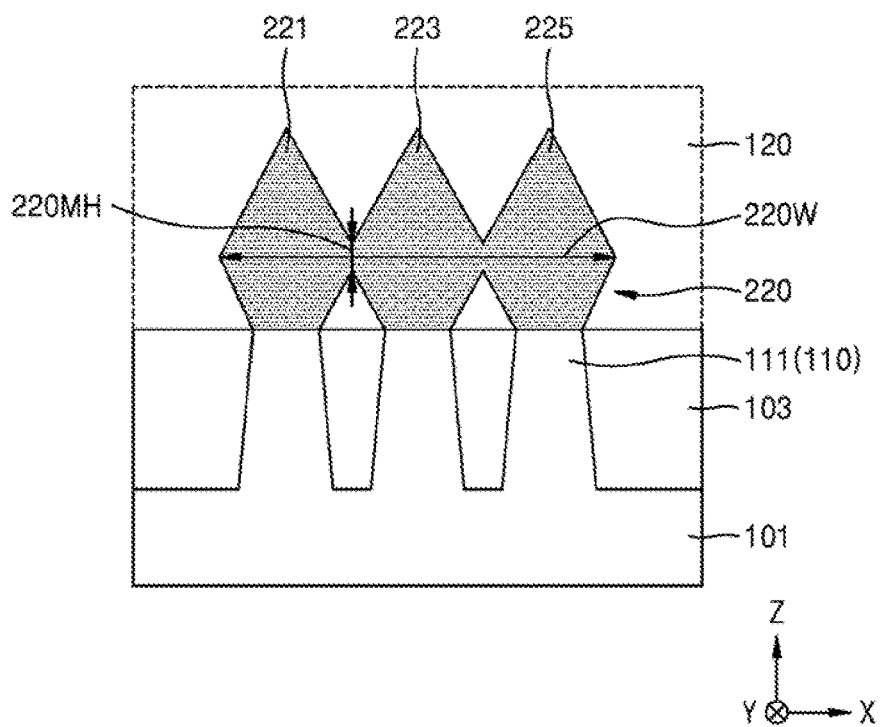

Referring to FIG. 4D, a second source/drain layer 220 may grow such that respective adjacent source/drain layers 221, 223, and 225 form contact regions therebetween.

For improving performance of a semiconductor device arranged in the logic region 1110 (refer to FIG. 1), forming low contact resistance between adjacent source/drain layers 221, 223, and 225 is crucial. Such a low resistance contact may be formed by adding a highly-concentrated impurities in a source/drain structure. The high concentrated impurities may further promote the growth of the crystal surfaces constituting the top and side surfaces of the epitaxial layer which may be the (111) crystal surfaces. Because of increased growth rate of the source/drain layers which include highly concentrated impurities, the contact regions between the adjacent source/drain structures may be reduced.

Because entire width 220W of the second source/drain layer 220 in a direction parallel to the upper surface of the substrate 101 (X direction) may be limited to a certain value in accordance with the design rule of the semiconductor device, the second source/drain layer 220 is also formed to have a restricted structure within the design rule. An area of contact region 220MH may be reduced as compared with the case where the concentration of impurities is relatively low. The low concentration of impurities may be about 1.4e21/cm3 or less.

Such an area reduction in the contact region 220MH may cause a defect such as a crack in the contact region 220MH when forming a contact plug in a subsequent process. As a result, the reduced contact regions 220MH of the second source/drain layer 220 containing the high concentration of impurities may affect the electrical characteristics and manufacturing efficiency of the semiconductor device.

Figure 4E:
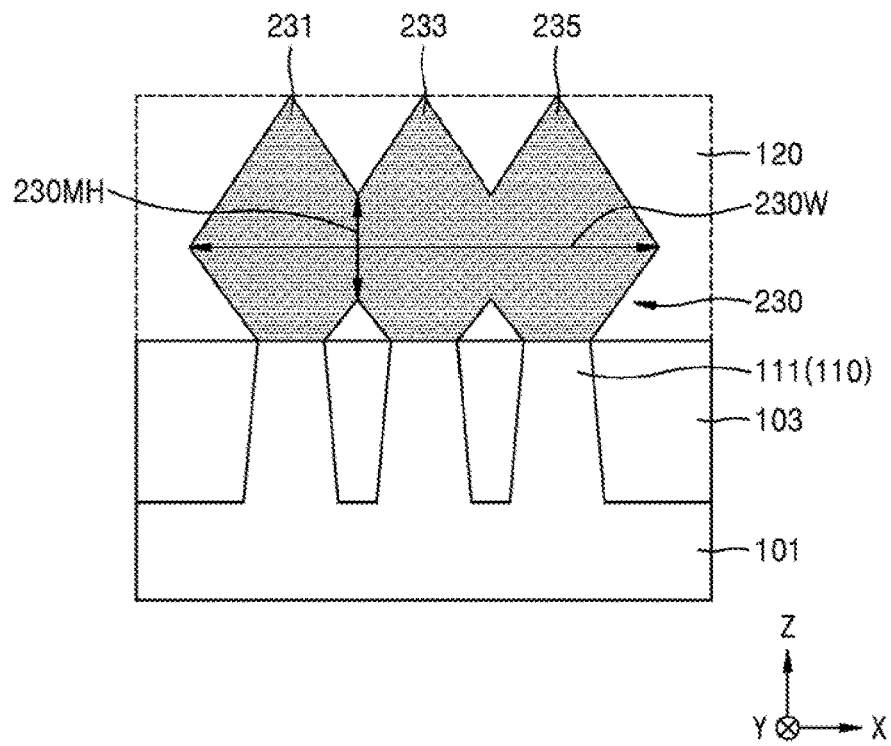

Referring to FIG. 4E, a third source/drain layer 230 may overgrow such that adjacent source/drain layers 231, 233, and 235 may form larger contact regions.

The third source/drain layer 230 may overgrow so as to form a contact region 230MH to a degree similar to when the concentration of impurities is low. In this case, the contact region 230MH may satisfy a structural performance of the semiconductor device, but a width 230W of the third source/drain layer 230 may be longer than a width allowed by design rule of the semiconductor device.

The principal reason of the problem mentioned above is that the facet may be formed on a specific crystal surface which have different growth rates compared with other crystal surfaces. For example, the growth rate on the (111) crystal surface may be lower than those on a (110) crystal surface and a (100) surface. When the third source/drain layer 230 is free to grow, the facet may finally have the (111) crystal surface. For example, the facet may exist as the (111) crystal surface. In an initial growth stage of the third source/drain layer 230, facets may not be sufficiently formed. However, as the epitaxial growth progresses, facets may gradually appear due to differences in the growth rates. Thus, the crystal surface on the side surface of the third source/drain layer 230 may include the (111) crystal surface and the growth rate of the source/drain structure may be excessive resulting in violating design rule relating with the width 230W.

Figure 4F:
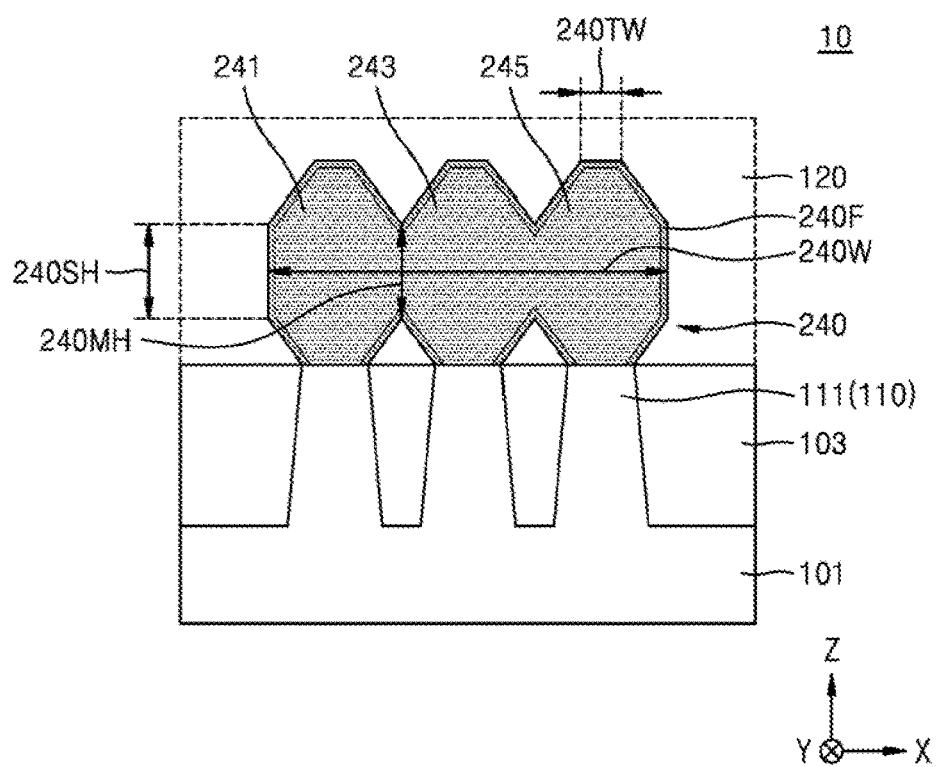

Referring to FIG. 4F, the semiconductor device 10 including a source/drain assembly 240 may be formed by stopping the growth of each of adjacent source/drain layers 241, 243, and 245 and performing an etching process.

After the third source/drain layer 230 (refer to FIG. 4E) is formed, the epitaxial growth may be stopped and the etching process may be performed. The etching process may be performed, for example, by injecting an etching gas, such as germane ($GeH_4$), into the same process chamber as the process chamber in which the epitaxial layer is formed. In some embodiments, the epitaxial growth process and the etching process may be performed in an in-situ manner. For example, the epitaxial growth process and the etching process may be performed in the same process chamber without a vacuum break therebetween.

During the etching process, Ge element included in the etching gas, $GeH_4$, may be bonded onto an outer portion 240F of the source/drain assembly 240. For example, the source/drain assembly 240 formed in the nFET region may be a Si epitaxial layer including P as an impurity, and concentration of P impurity may be about $1.8 \times 10^{21}/cm^3$ or more. The source/drain assembly 240 may include the material composition and structure described above with reference to FIG. 3, thus, will not be repeated herein. The outer portion 240F of the source/drain assembly 240 may include Si and Ge therein, and the inner portion 240I (see FIG. 3) of the source/drain assembly 240 may include Si but not Ge therein.

Because the Ge element on the source/drain assembly may change the impurity concentration of crystal surface, the source/drain assembly 240 may be formed which includes a contact region 240MH on which epitaxial growth rate is maintained to that of the epitaxial growth rate of low concentrated impurities epitaxial layer. Thus, excessive growth of the source/drain layer may be limited to the same with the case of contact region size of low impurity concentration while a width 240W satisfying the design rule of the semiconductor device 10.

During the etching process, the sharp protrusions on the top surface and the side surface of the source/drain assembly 240 may be removed more than a flat portion thereof. As illustrated in FIG. 4F, in a cross-sectional view of the source/drain assembly 240 taken along a direction parallel to the gate structure 120, each of the source/drain layers 241, 243, and 245 may have a length 240TW of the uppermost surface of the source/drain assembly 240 in a direction parallel to the upper surface of the substrate 101 (X direction) be etched to be less than a length 240SH of the side surface of the source/drain assembly 240 in a direction perpendicular to the upper surface of the substrate 101 (Z direction).

For example, according to exemplary embodiment, the semiconductor device 10 according to the inventive concept may have improved electrical characteristics due to control of the epitaxial growth along the crystal surfaces of the source/drain assembly 240 and by increasing the contact region 240MH between adjacent source/drain layers 241, 243, and 245.

Figure 4G:
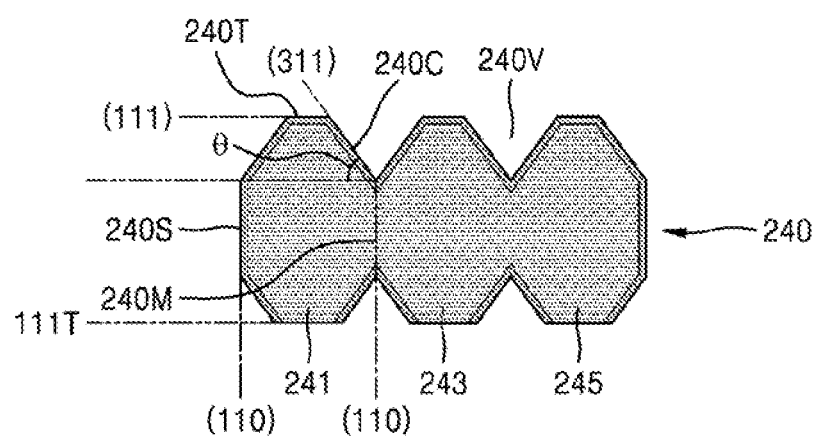

Referring to FIG. 4G, respective crystal surfaces of the source/drain assembly 240 and an angle therebetween are illustrated.

The source/drain assembly 240 may include different crystal surfaces depending on the epitaxial growth and the etching process. The growth rate of the (111) crystal surface may be less than that of the (110) crystal surface and the growth rate of the (110) crystal surface may be less than that of the (100) crystal surface. This may be because the growth rate depends on surface bonding of a crystal surface. Thus, the facet may be formed due to differences in the growth rates of different crystal surfaces.

Unlike the growth rate, the etching rate of the (111) crystal surface may be less than that of the (100) crystal surface, and the etching rate of the (100) crystal surface may be less than that of the (110) crystal surface. This may be due to characteristics which mean that the etching rate depends on surface bonding and in-plane bonding of the crystal surface. Accordingly, the source/drain assembly 240 may include different crystal surfaces due to different etching rates of the different crystal surfaces.

In the source/drain assembly 240, a contact region 240M may be the (110) crystal surface, the uppermost surface 240T may be the (111) crystal surface, and an inclined surface 240C connecting the uppermost surface 240T and the contact region 240M may be a (311) crystal surface. For example, a top surface of the source/drain assembly 240 may have a V-shaped groove 240V and at least one of surfaces forming the V-shaped groove 240V may be the (311) crystal surface.

As illustrated in FIG. 4G, in the cross-sectional view of the source/drain assembly 240 taken along a direction parallel to the gate structure 120, an angle θ formed by the top surface 111T of the fin structure 110 and the inclined surface 240C may be less than about 54.7°. Here, an angle of about 54.7° may be an angle formed by the top surface 111T of the fin structure 110 of the epitaxial growth including the low concentration of impurities and the (311) crystal surface, for example, the inclined surface 240C. The angle θ may preferably be less than about 45°, via the etching process. For example, the angle θ of the source/drain assembly 240 may in the result of performing both the epitaxial growth and the etching processes.

FIGS. 5A through 5D are cross-sectional views illustrated in a process sequence to describe a method of fabricating the semiconductor device 20 according to an embodiment of the inventive concept.

Figure 5A:
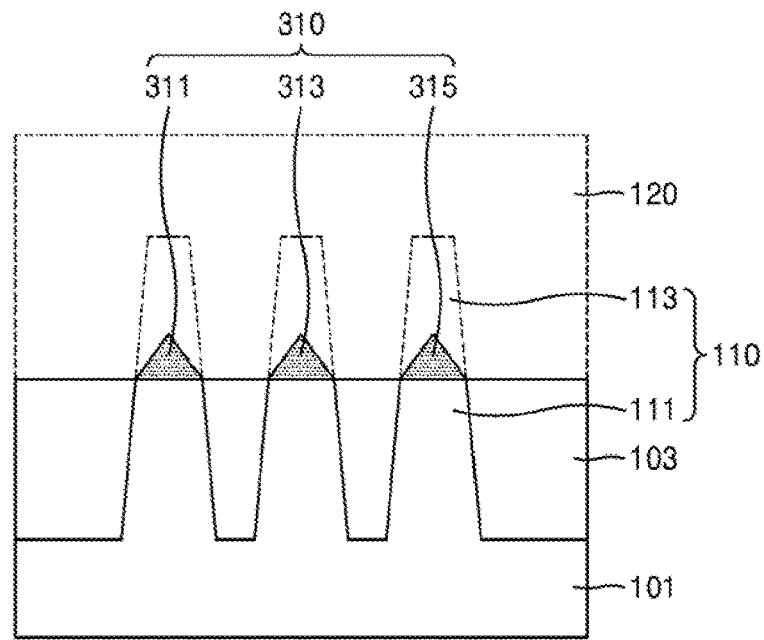
FIGS. 5A through 5D are cross-sectional views illustrated according to a process sequence to describe a method of fabricating a semiconductor device according to an exemplary embodiment of the inventive concept.

Referring to FIG. 5A, a first source/drain layer 310 may be formed on the bottom pattern 111 of the fin structure 110.

Respective source/drain layers 311, 313, and 315 of the first source/drain layer 310 may be grown separately from each other on the bottom pattern 111 of the fin structure 110 at a uniform height. Here, a process of forming the first source/drain layer 310 by doping P as an impurity in the nFET region will be described. In addition, the doping concentration of P may be about $1.8 \times 10^{21}/cm^3$ or more. In this manner, contact resistance may be reduced by doping with a high concentration of impurities.

As shown in FIG. 5A, the first source/drain layer 310 may include three source/drain layers 311, 313, and 315 formed on the bottom pattern 111 of the fin structure 110, but is not limited thereto.

Figure 5B:
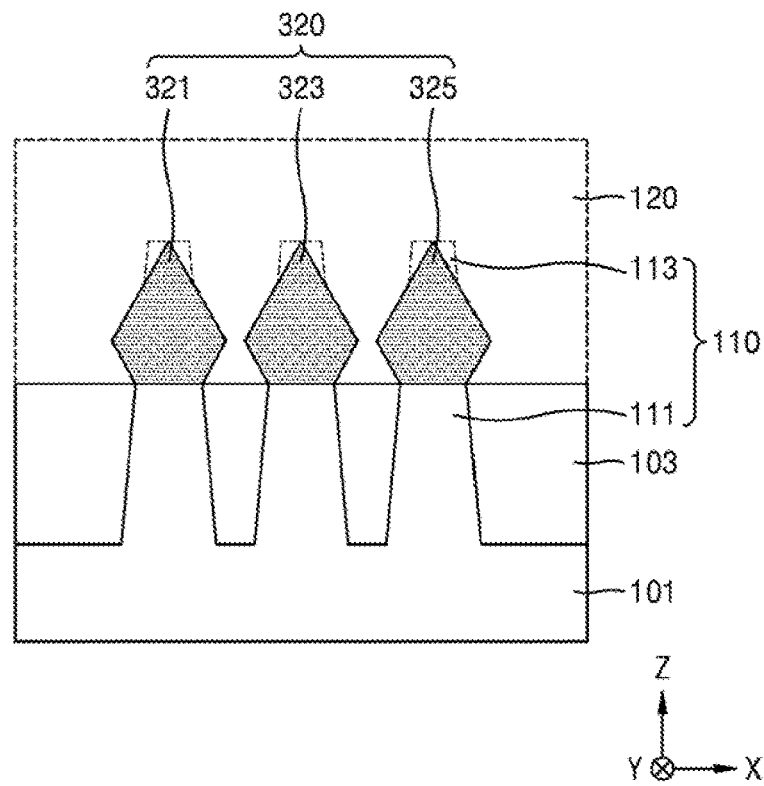
Figure 5C:
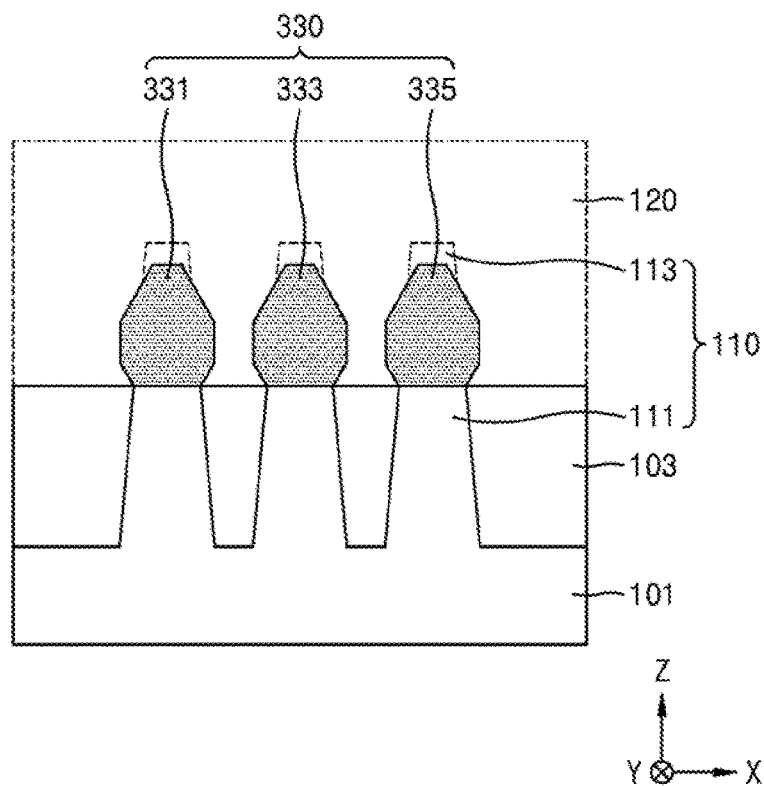

Referring to FIGS. 5B and 5C, a second source/drain layer 320 may include adjacent source/drain layers 321, 323, and 325. Next, a third source/drain layer 330 may be formed in which the sharp protrusions on the top surface and the side surfaces thereof are flattened during the etching process.

The high concentration of impurities may further promote the growth of the crystal surfaces constituting the top surface and the side surfaces of the epitaxial layer, for example, the (111) crystal surface, so that the contact regions between adjacent source/drain structures including the high concentration of impurities is reduced.

Thus, in order to form a large contact region, the second source/drain layer 320 may be grown to a certain size so that the adjacent source/drain layers 331, 333, and 335 are separated from each other, and then, the third source/drain layer 330 may be formed by performing the etching process such that the sharp protrusions on the top surfaces and the side surfaces thereof are flat.

A combination of the growth process and the etching process may be referred to as a growth/etching cycle. In some embodiments, forming the third source/drain layer 330 may include only one growth/etch cycle. In other embodiments, the third source/drain layer 330 may be formed via two to five growth/etch cycles. Although not illustrated, a structure obtained via two to five growth/etch cycles may be similar to that of the third source/drain layer 330.

The epitaxial growth may be performed on remaining portions of an etched epitaxial layer. In some embodiments, the etched epitaxial layer and a newly grown epitaxial layer may be comprised with the same material (e.g., the same material composition). In other embodiments, the etched epitaxial layer and the newly grown epitaxial layer may include different materials (e.g., different material compositions). A plurality of growth/etch cycles may be repeated to further increase a region of the epitaxial layer. The growth/etching cycles may be performed in an in-situ manner without a vacuum break therebetween. For example, the etching process may be performed by injecting an etching gas such as hydrochloride (HCl) into the same process chamber as the process chamber in which the epitaxial layer is formed. In the growth/etching cycle process, Ge may not be formed on the outer surface of the third source/drain layer 330 because an etching gas such as $GeH_4$ may not be used.

As the growth/etch cycles are repeated, a profile of the third source/drain layer 330 may become more conformal.

Figure 5D:
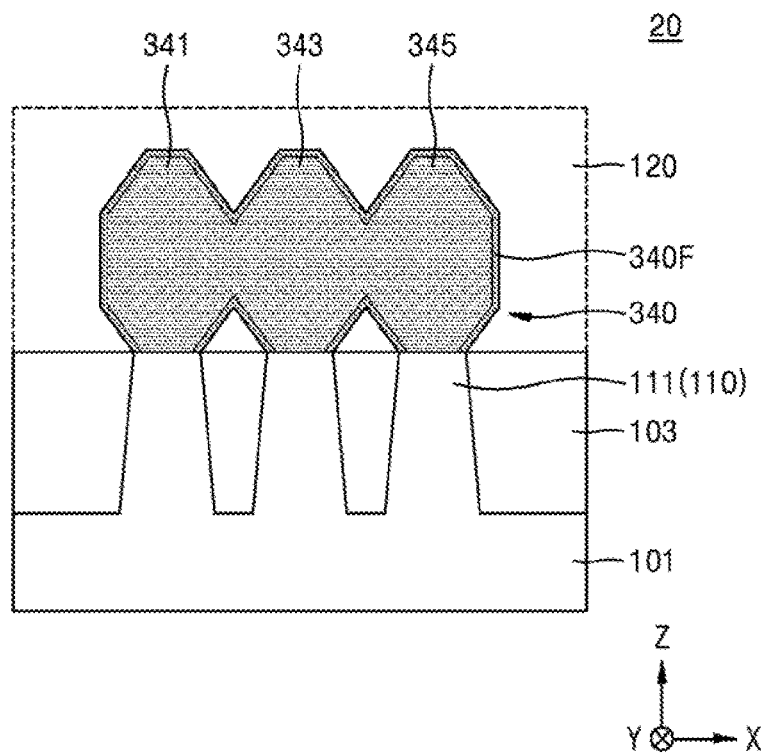

Referring to FIG. 5D, the growth process of each of adjacent source/drain layers 341, 343, and 345 may be stopped and a final etching process may be performed in order to form the semiconductor device 20 including a fourth source/drain assembly 340.

After one or more growth/etch cycle processes are performed on the second source/drain layer (refer to 320 in FIG. 5B) so that respective source/drain layers 311, 313, and 315 have certain contact regions with each other, the epitaxial growth may be stopped and a final etching process may be performed. For example, the final etching process may be performed by injecting an etching gas such as $GeH_4$ into the same process chamber as the process chamber in which the epitaxial layer is formed.

During the final etching process, Ge generated in $GeH_4$, the etching gas, may bond to an outer portion 340F of the source/drain assembly 340. For example, the source/drain assembly 340 formed in the nFET region may be the epitaxial layer including P as an impurity at a concentration of about $1.8 \times 10^{21}/cm^3$ or more, may include Si and Ge on the outer portion 340F thereof, and may include Si but not Ge in an inner portion of the source/drain assembly 340. As a result, the source/drain assembly 340 may be formed so as to have a width satisfying a certain value in accordance with the design rule of the semiconductor device 20, while a value of the low concentration of impurities of the contact region also is substantially the same as that of the epitaxial growth.

FIGS. 6A through 6D are cross-sectional views illustrated in a process sequence to describe a method of fabricating the semiconductor device 30, according to an embodiment of the inventive concept.

Referring to FIG. 6A, a first source/drain layer 410 may be formed on the bottom pattern 111 of the fin structure 110.

Source/drain layers 411, 413, and 415 of the first source/drain layer 410 may be grown on the bottom pattern 111 of the fin structure 110 at a uniform height. Here, a process of forming the first source/drain layer 410 by doping P as an impurity in the nFET region will be described. The doping concentration of P may be about $1.8 \times 10^{21}/cm^3$ or more. As described above, the contact resistance may be lowered by doping with a high concentration of impurities.

As shown in FIG. 6A, the first source/drain layer 410 may include three source/drain layers 411, 413, and 415 formed on the bottom pattern 111 of the fin structure 110, but is not limited thereto.

Figure 6C:
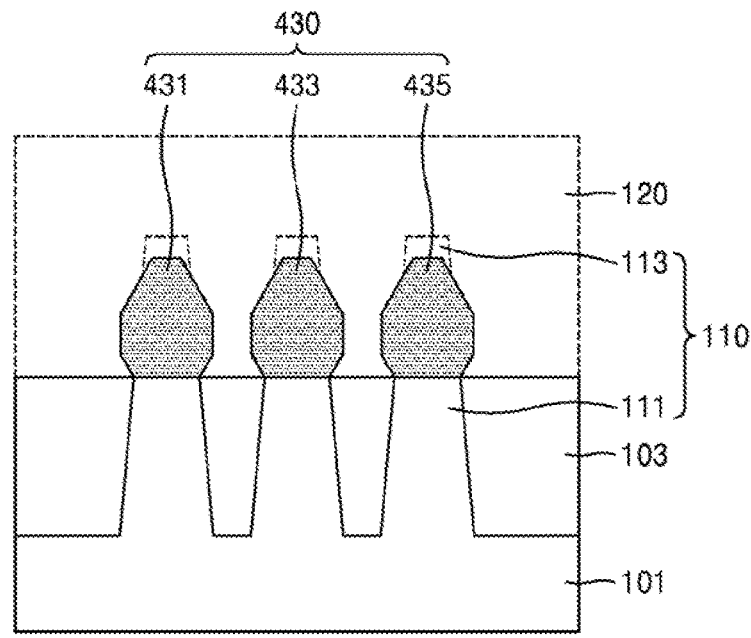

Referring to FIGS. 6B and 6C, a second source/drain layer 420 may include adjacent source/drain layers 421, 423, and 425, each of which is separately grown. Next, a third source/drain layer 430 may be formed in which sharp protrusions on top surfaces and side surfaces of the second source/drain layer 420 are flattened via the etching process.

The combination of the growth process and the etching process may be referred to as the growth/etching cycle. In some embodiments, forming the third source/drain layer 430 may include only one growth/etch cycle. In other embodiments, the third source/drain layer 430 may be formed via two to five growth/etch cycles. Although not illustrated, a structure obtained via two to five growth/etch cycles may be similar to that of the third source/drain layer 430.

Epitaxial growth may be performed on remaining portions of the etched epitaxial layer. In some embodiments, the etched epitaxial layer and a newly grown epitaxial layer may include the same material (e.g., the same material composition). In other embodiments, the etched epitaxial layer and the newly grown epitaxial layer may include different semiconductor materials (e.g., different material compositions). The plurality of growth/etch cycles may be repeated to further increase a region of the epitaxial layer. The growth/etch cycles may be performed in an in-situ manner without a vacuum break therebetween. For example, the etching process may be performed by injecting an etching gas such as hydrochloride (HCl) into a process chamber which is the same as the process chamber in which the epitaxial layer is formed. In the growth/etch cycle process, Ge may not be formed on the outer surface of the third source/drain layer 430 because an etching gas such as $GeH_4$ may not be used.

As the growth/etch cycles are repeated, a profile of the third source/drain layer 430 may become more conformal.

Figure 6D:
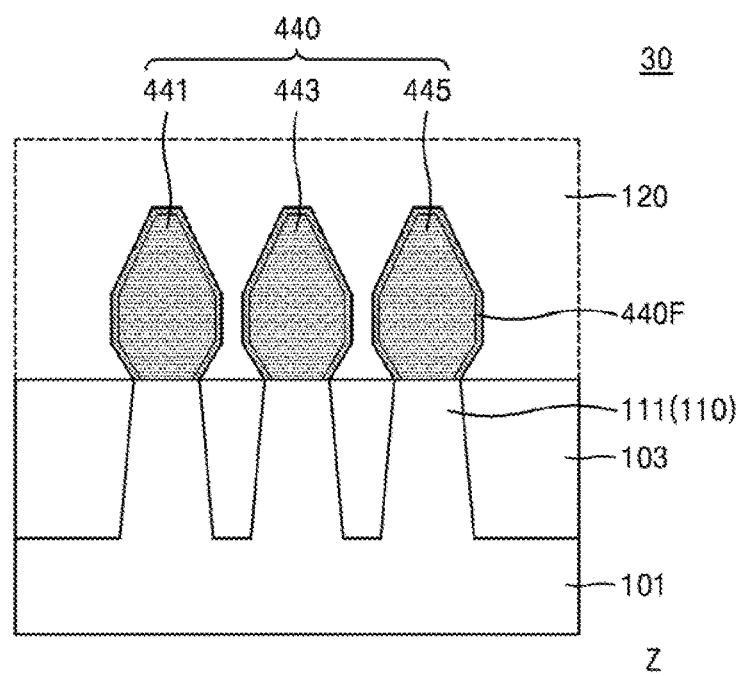

Referring to FIG. 6D, the growth process of respective adjacent source/drain layers 441, 443, and 445 may be stopped and a final etching process may be performed in order to form the semiconductor device 30 including a source/drain structure 440.

After the third source/drain layer 430 (refer to FIG. 6C) is formed, the epitaxial growth is stopped and the final etching process is performed. For example, the etching process may be performed by injecting an etching gas, such as $GeH_4$, into the same process chamber as the process chamber in which the epitaxial layer is formed.

During the etching process, Ge generated in $GeH_4$, the etching gas, may bond to an outer portion 440F of the source/drain structure 440. The source/drain structure may include an impurity (e.g., an n-type impurity or an p-type impurity) in an outer portion of the source/drain structure 440F and the impurity is not included in an inner portion of the source/drain structure 440. For example, the source/drain structure 440 formed in the nFET region may be the epitaxial layer including P as an impurity at a concentration of about $1.8 \times 10^{21}/cm^3$ or more, may include Si and Ge on the outer portion 440F thereof, and may include Si but not Ge in an inner portion of the source/drain structure 440.

Sharp protrusions of the source/drain structure 440 may be removed more than flat portions thereof during the etching process so that each profile of the source/drain layers 441, 443, and 445 constituting the source/drain structure 440 is formed into an octagonal shape.

The semiconductor device 30 may be manufactured such that contact plugs are formed on the source/drain layers 441, 443, and 445, respectively. Alternatively, the semiconductor device 30 may be fabricated to further include an element that may not be formed in the element isolating layer 103 in a process performed before forming the contact plug.

FIGS. 7A to 7D are cross-sectional views illustrated in a process sequence to describe a method of manufacturing the semiconductor device 40 according to an embodiment of the inventive concept.

Figure 7A:
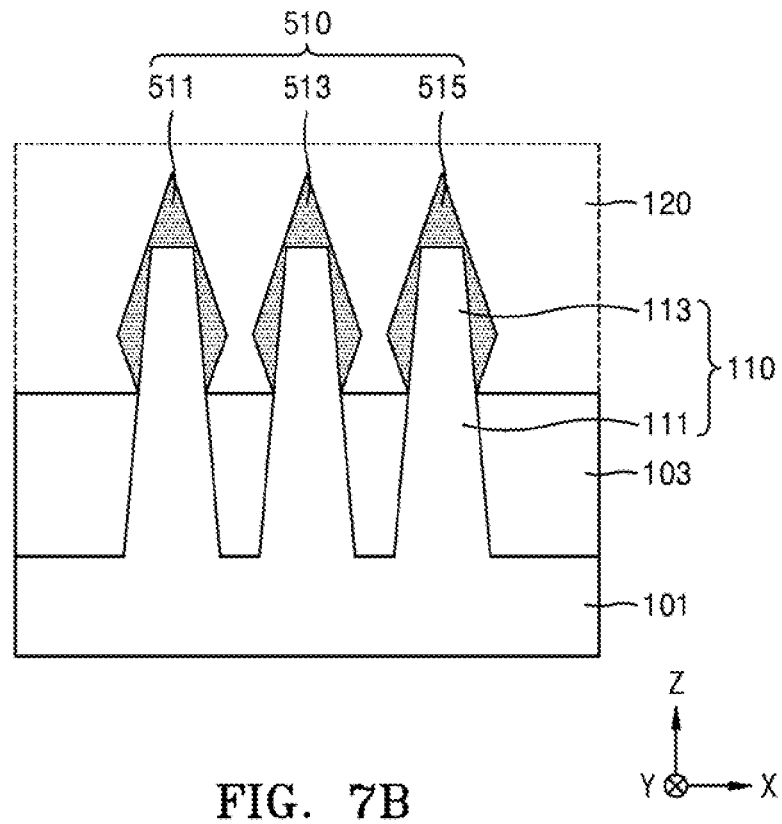
FIGS. 7A to 7D are cross-sectional views illustrated according to a process sequence to describe a method of manufacturing a semiconductor device according to an exemplary embodiment of the inventive concept.

Referring to FIG. 7A, the semiconductor device 40 may include the top pattern 113 of the fin structure 110 constituting a first source/drain layer 510 epitaxially grown on the top pattern 113 of the fin structure 110.

Since the epitaxial growth on the (111) crystal surface may be less than that on other crystal surfaces, the outer periphery of the first source/drain layer 510 may not have the same profile as an initial profile of the top pattern 113 of the fin structure 110. Instead, the outer peripheries of the first source/drain layer 510 may extend to the top surfaces and the side surfaces of the fin structure 110 and may form facets. This movement may reduce spaces between the source/drain layers 511, 513, and 515 growing on adjacent fin structures 110.

Figure 7B:
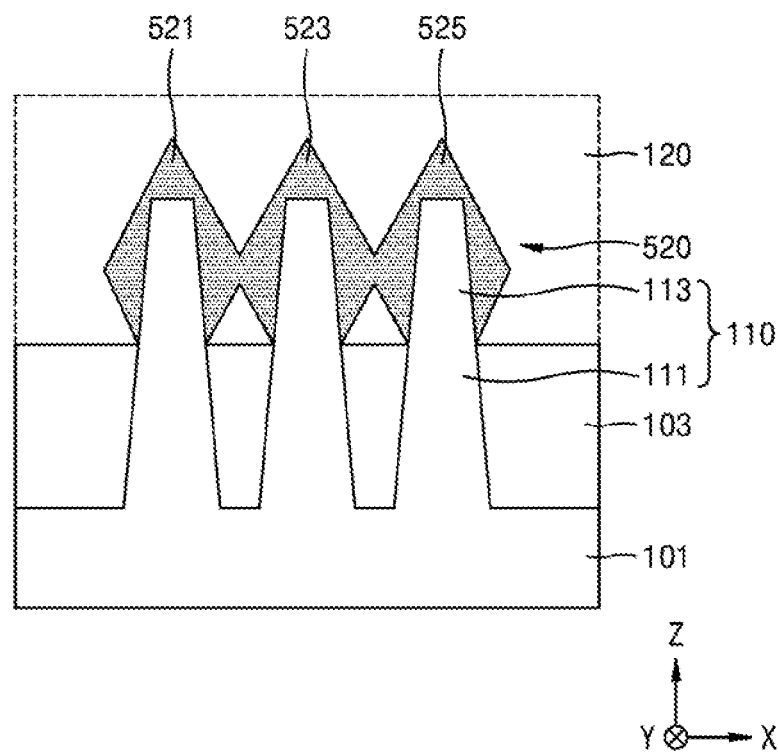

Referring to FIG. 7B, a second source/drain layer 520 may grow such that a contact region is formed between each of the adjacent source/drain layers 521, 523, and 525.

A high concentration of impurities may further promote the growth of the crystal surfaces constituting top surfaces and side surfaces of the epitaxial layer or, for example, the (111) crystal surface, such that the contact regions between adjacent source/drain structures including the high concentration of impurities are reduced.

For example, an entire width of the second source/drain layer 520 may be limited to a certain value in accordance with the design rule of a semiconductor device. When the second source/drain layer 520 is formed to satisfy the certain value, the contact regions may be reduced as compared with a case where the impurity concentration is low.

Figure 7C:
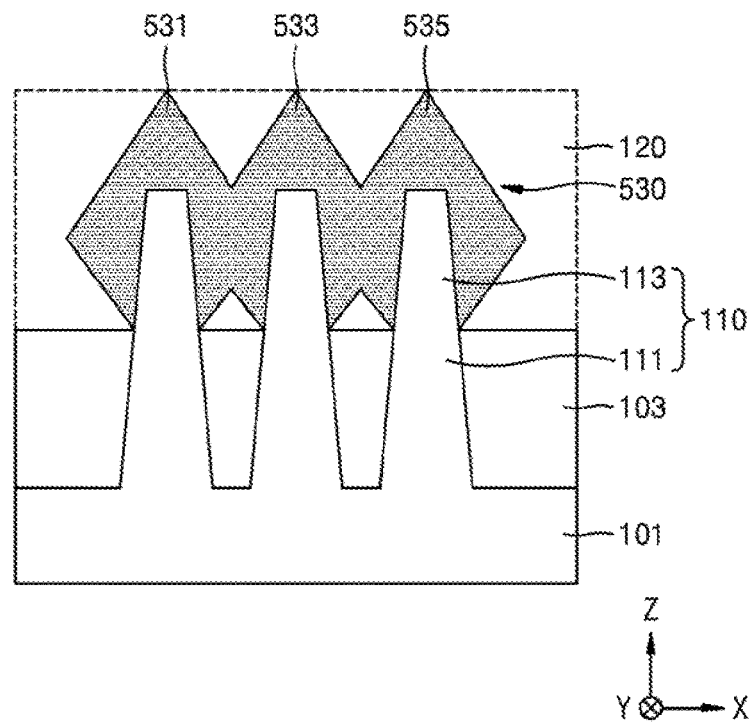

Referring to FIG. 7C, a third source/drain layer 530 may overgrow such that adjacent source/drain layers 531, 533, and 535 may form larger contact regions.

The third source/drain layer 530 may overgrow so as to form the contact regions to a degree similar to a case in which the impurity concentration is low. In this exemplary embodiment, the contact regions may satisfy a structural performance of the semiconductor device, but a width of the third source/drain layer 530 may be out of a certain value in accordance with the design rule of the semiconductor device.

Figure 7D:
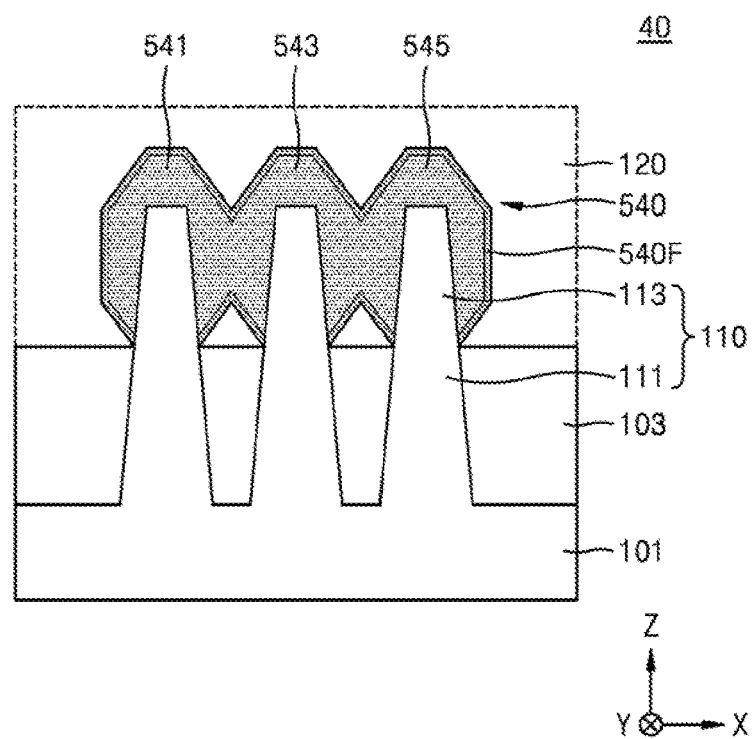

Referring to FIG. 7D, the semiconductor device 40 including a source/drain assembly 540 may be formed by stopping the growth of each of adjacent source/drain layers 541, 543, and 545 and performing an etching process.

After the third source/drain layer 530 (refer to FIG. 7C) is formed, the epitaxial growth is stopped and the etching process is performed. For example, the etching process may be performed by injecting an etching gas such as $GeH_4$ into the same process chamber as the process chamber in which the epitaxial layer is formed. In some embodiments, the epitaxial growth process and the etching process may be performed in an in-situ manner. For example, the epitaxial growth and the etching process may be performed in the same process chamber without a vacuum break therebetween.

During the etching process, Ge generated from the etching gas $GeH_4$ may bond to an outer portion 540F of the source/drain assembly 540. For example, the source/drain assembly 540 formed in the nFET region may be the epitaxial layer including P as an impurity at a concentration of about $1.8\times10^{21}/cm^3$ or more, may include Si and Ge on the outer portion 540F thereof, and may include Si but not Ge in an inner portion of the source/drain assembly 540.

As a result, the source/drain assembly 540 may be formed which has a width satisfying a certain value in accordance with the design rule of the semiconductor element 40 while a value of the low concentration of impurities of the contact regions also is substantially the same as that of the epitaxial growth.

For example, the semiconductor device 40 according to the inventive concept may have excellent electrical characteristics by controlling the epitaxial growth along crystal surfaces of the source/drain assembly 540 and increasing the contact regions between adjacent source/drain layers 541, 543, and 545.

Figure 8:
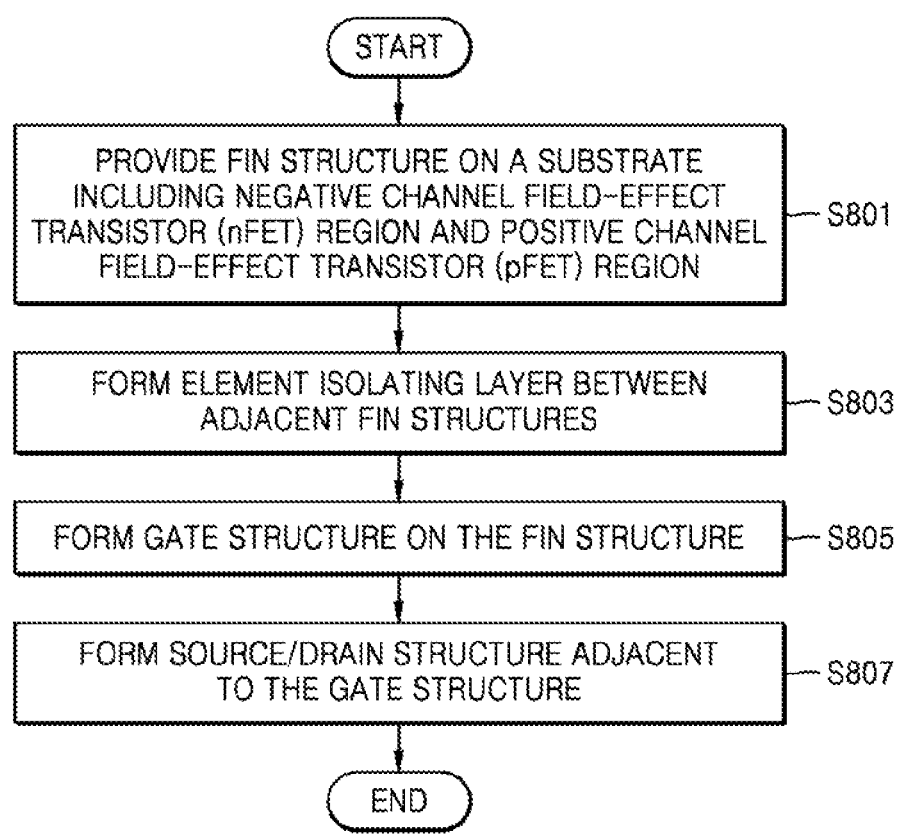
FIG. 8 is flow chart showing a method of manufacturing a semiconductor device according to exemplary embodiments of the inventive concept.

FIG. 8 is flow chart showing a method of manufacturing a semiconductor device according to exemplary embodiments of the inventive concept.

In step S801, a fin structure is provided on a substrate, e.g., a semiconductor wafer W, including a negative channel field-effect transistor (nFET) region and a positive channel field-effect transistor (pFET) region. The fin structure may be a fin structure 110 and the substrate may be a substrate 101 according to the exemplary embodiments as disclosed above. The fin structure 110 may be formed on the substrate 101 so as to extend in the second direction (Y direction).

In step S803, an element isolating layer is formed between adjacent fin structures. The element isolating layer may be an element isolating layer 103 according to the exemplary embodiments as disclosed above. The element isolating layer 103 may include the material described above with reference to FIG. 3. The top surface of the fin structure 110 and the top surface of the element isolating layer 103 may be arranged on the same plane via a planarization process.

In step S805, a gate structure is formed on the fin structure 110. The gate structure may be a gate structure 120 according to the exemplary embodiments as disclosed above. The gate structure 120 may include the gate insulating layer 130 and the gate electrode 150. In some embodiments, the gate structure 120 may be formed via a gate replacement process, but is not limited thereto.

In step S807, a source/drain structure is formed adjacent to the gate structure 120. The source/drain structure may be a first source/drain structure 201 (or the source/drain assembly 240, 340, 540 or the source/drain structure 440) according to the exemplary embodiments as disclosed above. In some embodiments, the source/drain structure 201 formed in the nFET region may include: a top pattern 113 of the fin structure 110 which is a portion of the fin structure 110 protruding over the element isolating layer 103; and selective epitaxial growth (SEG) portion formed on a top surface and side surfaces of the top pattern 113 of the fin structure 110.

In some embodiments, an angle between an inclined surface portion of the uppermost surface of the SEG portion and the top surface of the top pattern 113 of the fin structure 110 is less than about 54.7°, and the SEG includes Si and Ge on an outer portion of the SEG portion and includes Si but not Ge in an inner portion of the SEG portion.

Semiconductor chips (having integrated circuits formed therein) may be cut from the wafer W and form elements of semiconductor device packages.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a fin structure on a substrate including a negative channel field-effect transistor (nFET) region;
   a gate structure formed on the fin structure; and
   a source/drain structure formed adjacent to the gate structure, the source/drain structure being formed with an epitaxial layer n-type impurity, the concentration of the n-type impurity is about $1.8\times10^{21}/cm^3$, and the outer portion of the source/drain structure including silicon (Si) and germanium (Ge), and the inner portion of the source/drain structure including Si but not Ge, wherein an inclined surface portion of an uppermost surface of the source/drain structure forms an angle of less than about 54.7° with a top surface of the fin structure, wherein the source/drain structure includes a top surface and a side surface, each of the top surface and side surface being flat, and wherein both the top surface and the side surface contact the inclined surface portion.

2. The semiconductor device of claim 1, wherein the source/drain structure comprises a surface contacting adjacent source/drain structures.

3. The semiconductor device of claim 2, wherein the surface contacting the adjacent source/drain structures is a (110) crystal surface.

4. The semiconductor device of claim 3, wherein the uppermost surface of the source/drain structure is a (111) crystal surface.

5. The semiconductor device of claim 4, wherein, in a cross-section of the source/drain structure taken along a direction parallel to the gate structure, a length of the uppermost surface of the source/drain structure is less than that of the surface contacting the adjacent source/drain structures.

6. The semiconductor device of claim 1, wherein the angle formed with the top surface of the fin structure by the inclined surface portion is less than about 45°.

7. The semiconductor device of claim 1, wherein the inclined surface portion is a (311) crystal surface.

8. The semiconductor device of claim 1, wherein the source/drain structure is separate from adjacent source/drain structures.

9. The semiconductor device of claim 8, wherein, in a cross-section of the source/drain structure taken along a direction parallel to the gate structure, the source/drain structure has an octagonal profile.

10. The semiconductor device of claim 1, wherein the n-type impurity is phosphorus (P).

11. A semiconductor device comprising:
a fin structure on a substrate;
a gate structure on the fin structure; and
a source/drain structure adjacent to the gate structure,
wherein the source/drain structure forms a source/drain assembly in which adjacent source/drain structures are merged with each other via a (110) crystal surface and the source/drain assembly includes a different material on an outer portion of the source/drain assembly which is not included in an inner portion of the source/drain assembly, and
wherein top surfaces of the source/drain assembly comprise a V-shaped groove and at least one of surfaces forming the V-shaped groove is a (311) crystal surface.

12. The semiconductor device of claim 11, wherein the source/drain assembly comprises a structure including three source/drain structures.

13. The semiconductor device of claim 11, wherein the source/drain assembly comprises P as an impurity at a concentration of about $1.8 \times 10^{21}/cm^3$.

14. The semiconductor device of claim 11, wherein the source/drain assembly comprises silicon (Si) and germanium (Ge) on the outer portion of the source/drain assembly, and comprises Si but not Ge in the inner portion of the source/drain assembly.

15. A semiconductor device comprising:
a fin structure on a substrate including an nFET region and a pFET region;
an element isolating layer between the fin structures;
a gate structure on the fin structure; and
a source/drain structure adjacent to the gate structure,
wherein the source/drain structure formed in the nFET region includes: a top pattern of the fin structure which is a portion of the fin structure protruding over the element isolating layer; and a selective epitaxial growth (SEG) portion formed on a top surface and side surfaces of the top pattern of the fin structure,
wherein an angle between an inclined surface portion of an uppermost surface of the SEG portion and the top surface of the top pattern of the fin structure is less than about 45°, and the SEG portion includes Si and Ge on an outer portion of the SEG portion and includes Si but not Ge in an inner portion of the SEG portion.

16. The semiconductor device of claim 15, wherein the substrate and the fin structure comprise monocrystalline Si.

17. The semiconductor device of claim 16, wherein the top pattern of the fin structure and the inner portion of the SEG portion comprise the same material composition.

18. The semiconductor device of claim 15, wherein, in a cross-section of the source/drain structure taken along a direction parallel to the gate structure, the source/drain structure comprises an octagonal profile.

19. The semiconductor device of claim 15, wherein the SEG portion comprises P as an impurity at a concentration of about $1.8 \times 10^{21}/cm^3$.

* * * * *